United States Patent
Watanabe et al.

[11] Patent Number: 6,020,214
[45] Date of Patent: Feb. 1, 2000

[54] METHOD FOR MANUFACTURING THIN FILM TRANSISTOR ARRAY SUBSTRATE

[75] Inventors: Takahiko Watanabe; Osamu Sukegawa, both of Tokyo, Japan

[73] Assignee: NEC Corporation, Tokyo, Japan

[21] Appl. No.: 09/116,213

[22] Filed: Jul. 16, 1998

[30] Foreign Application Priority Data

Jul. 18, 1997 [JP] Japan ................................. 9-194330

[51] Int. Cl.⁷ ............................................... H01L 21/00
[52] U.S. Cl. ........................... 438/30; 438/158; 438/160
[58] Field of Search .............................. 438/30, 158, 160, 438/151, 152

[56] References Cited

U.S. PATENT DOCUMENTS

| | | | |
|---|---|---|---|
| 5,198,379 | 3/1993 | Adan | 437/41 |
| 5,610,082 | 3/1997 | Oh | 437/21 |
| 5,614,427 | 3/1997 | Den Boer et al. | 437/40 |
| 5,650,358 | 7/1997 | Gu et al. | 437/228 |
| 5,661,050 | 8/1997 | Den Boer et al. | 438/30 |
| 5,674,757 | 10/1997 | Kim | 437/21 |
| 5,719,078 | 2/1998 | Kim | 438/158 |
| 5,904,511 | 5/1999 | Misawa et al. | 438/154 |

FOREIGN PATENT DOCUMENTS 5-232509  9/1993  Japan .

*Primary Examiner*—John F. Niebling
*Assistant Examiner*—Michael S. Lebentritt
*Attorney, Agent, or Firm*—Sughrue, Mion, Zinn, Macpeak & Seas, PLLC

[57] ABSTRACT

In a large-sized liquid crystal display panel formed through multiple time exposure using a single mask, the storage capacity between a gate and a source of TFT is adjusted by making an offset for exposure at the exposure connecting portion to decrease variations in the feedthrough voltage in a screen. Further, by preparing the layout of an exposure mask such that the overlap area between a gate signal wire or a storage wire and a pixel electrode is made smaller the farther the overlap area is from a gate signal input part. By making the overlap area smaller, the storage capacity is made smaller, which decreases the variation of the feedthrough voltage in the single exposure area.

2 Claims, 10 Drawing Sheets

METHOD FOR MANUFACTURING THIN FILM TRANSISTOR ARRAY SUBSTRATE

BACKGROUND FOR THE INVENTION

1. Field of the Invention

The present invention relates to a method for manufacturing a thin film transistor array substrate.

2. Description of the Related Art

Recently, liquid crystal panels have widely been used in monitor screens of portable personal computers or desk-top personal computers and in project type monitor screens. Particularly, active matrix type liquid crystal panels comprising display pixels each provided with a thin film transistor (hereinafter called a TFT), which serves as a switch for an image signal, are excellent in picture quality such as a contrast or response speed, and widely used.

However, the liquid crystal display panel using TFT has a problem in that the display quality is lowered due to a display potential change called a feedthrough distributed on the display screen, the feedthrough being ascribable to a parasitic capacity of the transistor. Particularly, the distribution of the feedthrough on the display screen tends to become larger in a large size panel, causing a serious problem in the recent tendency to enlarge the screen size.

The feedthrough phenomenon will next be described. Generally, in an active matrix liquid crystal display which uses thin film transistors, the electric potential of the pixel capacity varies at the fall time of a gate write signal due to the parasitic capacity effect between gate source of the thin film transistor. This variation is called a feedthrough voltage. The feedthrough voltage $V_{FD}$ is given by equation (1) when it is expressed by using a TFT capacity $C_{GS}$ between the gate source, a liquid crystal capacity $C_{LC}$, a storage capacity $C_{SC}$ and a gate pulse amplitude $\Delta V_G$.

$$V_{FD} = (C_{GS} \cdot \Delta V_G)/C_{LC} + C_{SC} + C_{GS} \quad (1)$$

$V_{FD}$: feedthrough voltage,
$C_{GS}$: capacity between the TFT gate/source,
$C_{LC}$: liquid crystal capacity,
$C_{SC}$: storage capacity,
$\Delta V_G$: gate pulse amplitude.

Next, a description will be made with reference to the feedthrough voltage distributed in the array surface.

Equation (1) gives a gate signal, with ideal pulse, however in a actual active matrix LCD a rounding is developed on a gate write signal (scanning line selection pulse) inputted in the form of square pulse, as the distance from the input point increases due to the time constant, which causes a time difference generated during the time period from the start of the gate signal fall time until the time at which the transistor is turned completely off. Consequently the electric potential of the pixel capacity which is likely to vary due to the feedthrough is restored to some extent, and hence a difference is generated in the feedthrough voltage between the input side with a small rounding of the gate pulse and the non-input side with a large rounding of the gate pulse.

By calculating the rounding effect of the gate pulse, the feedthrough voltage $V_{FD}$ is expressed by equation (2).

$$V_{FD2} = (C_{GS} \cdot \Delta V_G + \int I_{DS} \Delta t)/(C_{LC} + C_{SC} + C_{GS}) \quad (2)$$

$\Delta t$: gate delay time due to the rounding of a pulse (time elapsed until TFT cut-off voltage),
$I_{DS}$: TFT mean current which flows for recharging within the above delay time.

Since $\Delta t$ is proportional to the wiring time constant (wiring resistance×wiring capacity), $\Delta t$ is negligibly small on the gate pulse input side and $I_{DS}\Delta t \approx 0$. Therefore, the feedthrough voltage difference between the gate pulse input side and the opposite side is given by equation (3) as the difference of equation (2) and equation (1).

$$\Delta V_{FD} = (\int I_{DS} \Delta t)/(C_{LC} + C_{SC} + C_{GS}) \quad (3)$$

As described above, since the differences of the feedthrough voltage in a display screen ascribable to the rounding of the gate signal waveform is proportional to the wiring time constant, the problem becomes larger as an LCD becomes larger.

In order to above the problem as mentioned above, as a method for reducing the distribution of the feedthrough voltage in the display screen, a method, in which the value of $(C_{LC}+C_{SC}+C_{GS})$ of equation (3) is made larger as much as possible, may be selected; however, an increase in wiring delay and lowering of opening ratio may also course the deteriration of the quality of LCD.

As an applicable method other than the above, there is a method in which the variation of the feedthrough voltage due to the rounding of the gate signal can be compensated by varying an auxiliary capacity of the transistor element in the display screen, the variation being made in the direction of the wiring. An example of this method is described with reference to FIG. 1 (refer to Japanese Patent Laid-open No. 232509/93).

In FIG. 1, numeral 5 denotes a gate signal line, 6 pixel electrode, 8 drain signal line, 12 interlayer insulation layer, 15, 16 and 17 storage capacity, 21 gate electrode, 22 drain electrode and 23 source electrode. In the prior art shown in FIG. 1, the storage capacity $C_{SC}$ of equation (2) is made larger toward the input side of gate signal and smaller as being spaced apart from the input side. Thus, the feedthrough voltage of the input side $V_{FD}^{IN}$ can be made smaller and that of the non-input side $V_{FD}^{OUT}$ largeer, with the result that the $\Delta V_{FD}$ becomes 0V.

However, the method shown in FIG. 1 is based on a single exposure on the display surface, and hence this method is difficult to apply to a large-sized panel, in which a large number of exposures are applied to prepare the display surface Now, a system of exposure processes for forming a pattern for a large-sized thin film transistor array substrate will be described. As exposure systems, there are two kinds of systems, one is a full exposure system (a full aligner system) and the other one is a stepping exposure system (a stepping aligner system). In the full exposure system, a product pattern is exposed through a mask of a large size which is equal to or larger than the screen size. With this system, since the screen to be exposed is limited in size by the size of an optical device and the mask, the exposure of a panel of excessibly large size cannot be effected.

On the other hand, in the stepping exposure system, exposure is effected by using a small mask and dividing the whole area of pattern into a number of sections. Particularly, in the case of a display which is formed from array patterns of the same element, any large display can be formed by performing the exposure process repeatedly using the same mask.

However, if the method disclosed in the aforesaid Japanese Patent Laid-open No. 232509/93 is applied to the stepping exposure process, each of the divided data differs from each other and hence masks must be separately provided for each exposure. An example is shown in FIG. 2.

According to FIG. 2, overlap portion 7 of gate signal line 5 and pixel electrode 6 on the thin film transistor array is made smaller in area stepwise as it is spaced apart from the side of the gate signal input. If the portions 7 are formed by the stepping exposure system, in which the product pattern is transversely divided into four sections, the exposure areas (1), (2), (3), (4) are formed in the manner as described above, and hence different masks must be prepared so as to correspond to each of the areas.

However, in this case, the prolonged exposure time caused by the increased number of the mask, complicated accuracy control of the mask connecting work and the mask/electrode overlapping work, and moreover, suspension of exposure work due to the need to prepare excessive number of masks have remarkably lowered the productivity of the system.

SUMMARY OF THE INVENTION

An object of the present invention is to provide a method for manufacturing a thin film transistor array substrate for use in a large size screen, in which a stepping exposure system is employed to uniformalize the feedthrough voltage distribution in the display screen without changing wiring materials, and without increasing the film thickness of wiring layer and the wiring width.

In order to achieve the above object, in the method for manufacturing the thin film transistor array substrate according to the present invention, a display is formed in the thin film transistor array substrate from array patterns by making a single mask stepping exposure, and said display has a thin film transistor and a pixel electrode at the intersection of a gate signal line and a drain signal line, and in a process for forming the thin film transistor within an exposure area for a single mask, an offset is made in such a direction as to increase alignment offset every time exposure is made so that the amount of overlap between the pattern of a gate electrode and the pattern of a source electrode increases the farther the overlap is from a gate signal input part to increase the parasitic capacity between the gate electrode and the source electrode.

Further, an auxiliary capacity is formed in the overlap portion by overlapping the pixel electrode and the gate signal line, or between said pixel electrode and an electrode formed so as to be given electric potential independent of the pixel electrode and interposing an interlayer insulation layer therebetween and the value of the auxiliary capacity can be decreased in the exposure area for a single mask stepwise as the auxiliary capacity is separated from the input side of gate signals.

The above and other objects, features, and advantages of the present invention will become apparent from the following description referring to the accompanying drawings which illustrates an example of a preferred embodiment of the present invention.

DETAILED DESCRIPTION OF THE PREFERRED EMBODIMENTS

Figure 1:
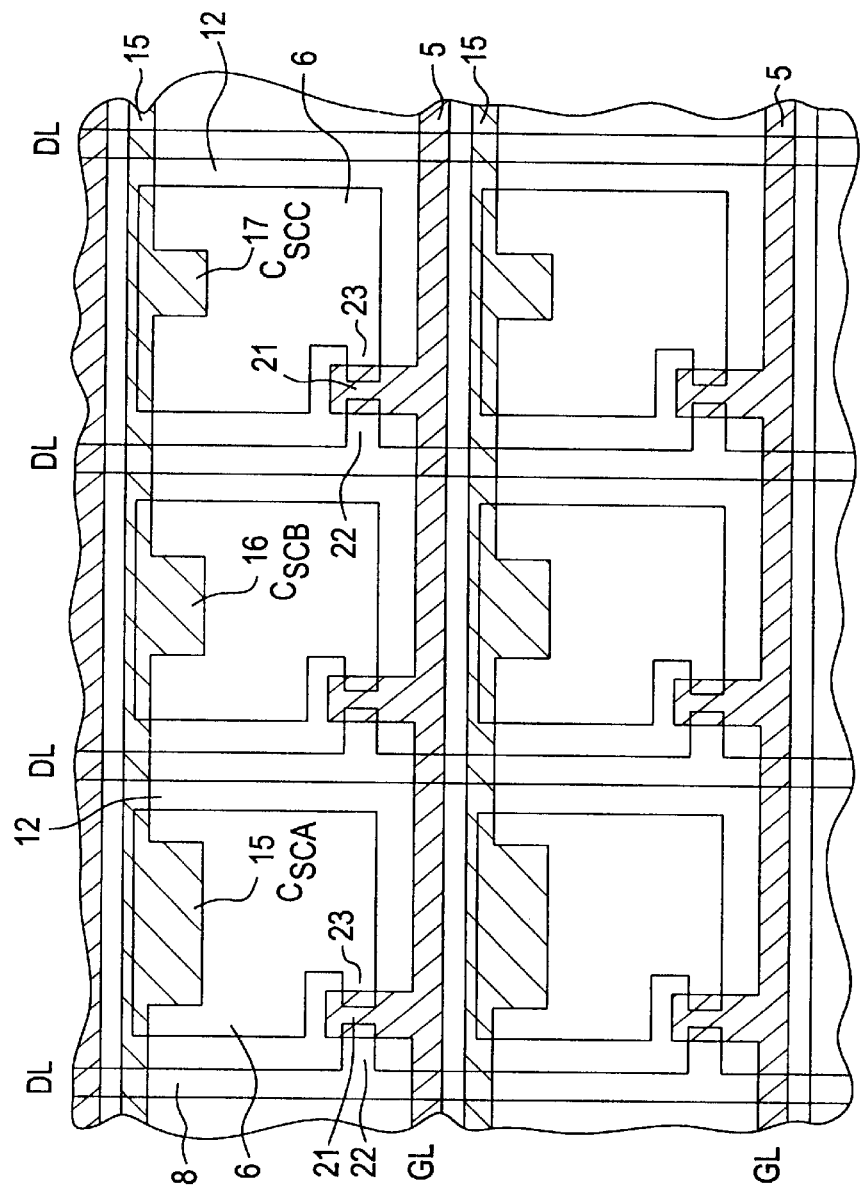
FIG. 1 is a plan showing the structure of a prior liquid crystal display unit.
Figure 2:
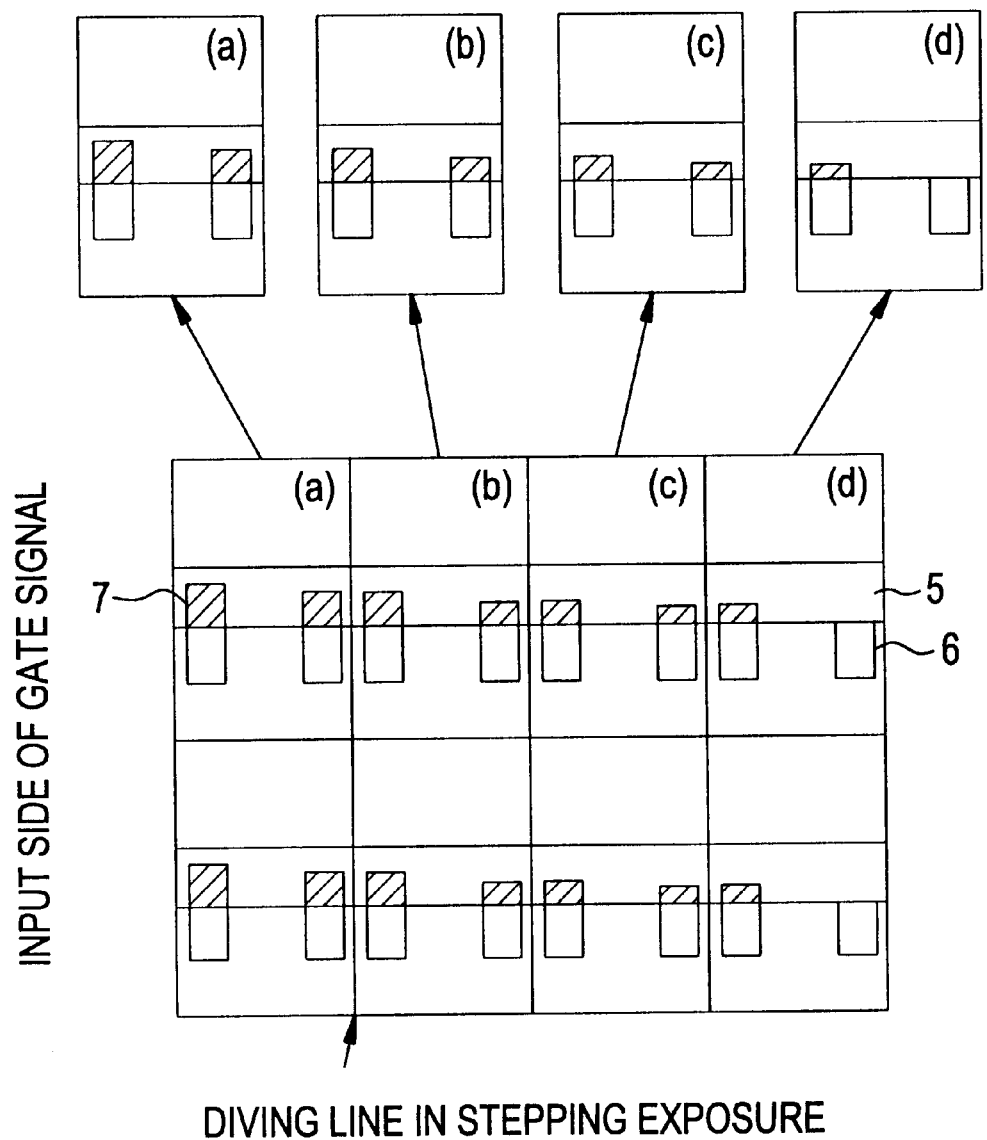
FIG. 2 is an explanatory view of a prior liquid crystal display unit.

An embodiment of the present invention will be described below referring to the drawings.

Figure 3:
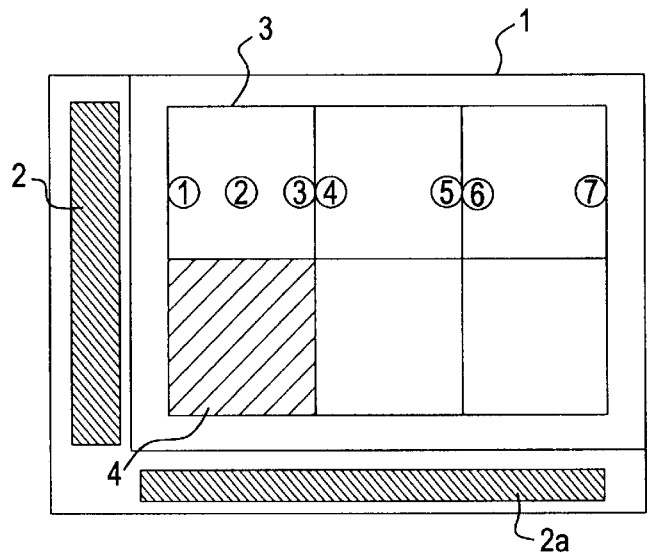
FIG. 3 is a plan showing a thin film transistor array substrate according to the present invention.
Figures 4A, 4B, 4C:
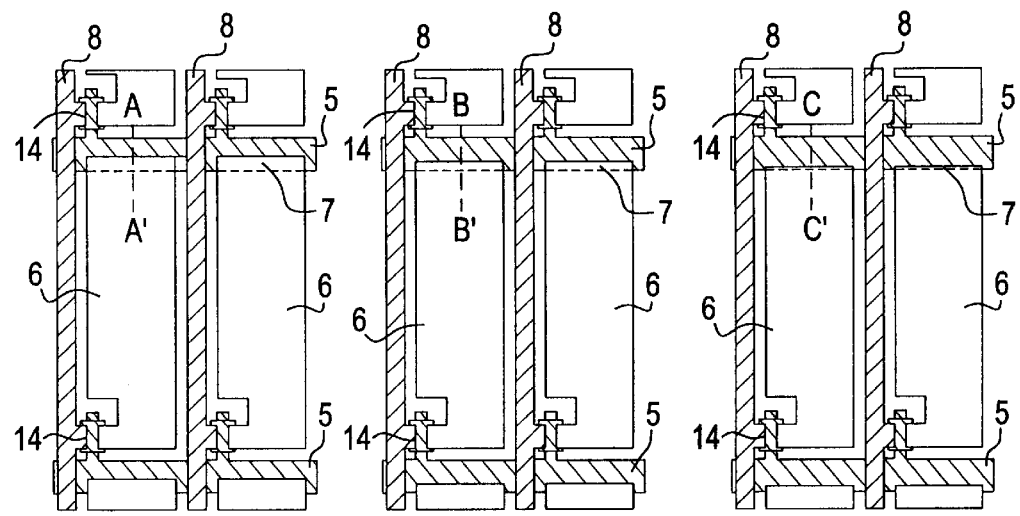
FIG. 4(a) is an enlarged view of the left side center portion ① of a single mask exposure area shown in FIG. 3.
FIG. 4(b) is an enlarged view of central portion ② of the single mask exposure area shown in FIG. 3.
FIG. 4(c) is an enlarged view of right side central portion ③ of the single mask exposure area shown in FIG. 3.
Figure 5A:
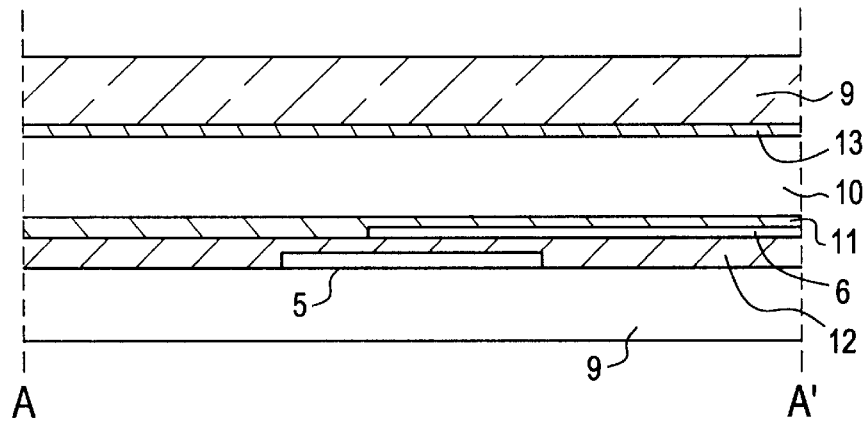
FIG. 5(a) is a section taken along the line A–A' of FIG. 4(a).
Figure 5B:
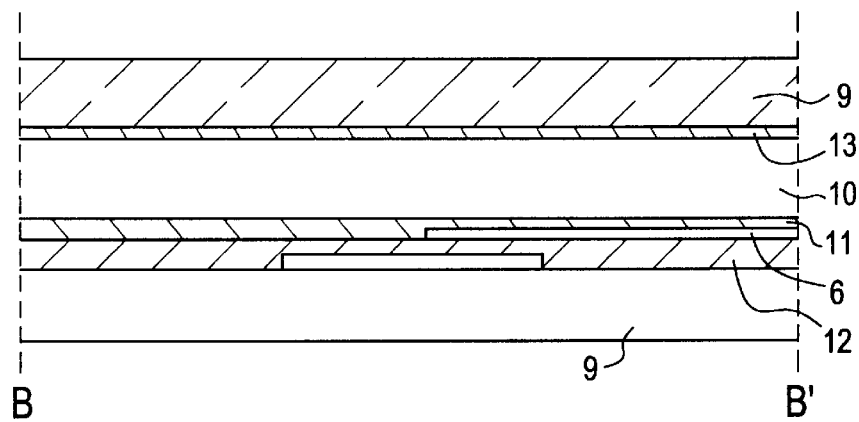
FIG. 5(b) is a section taken along the line B–B' of FIG. 4(b).
Figure 5C:
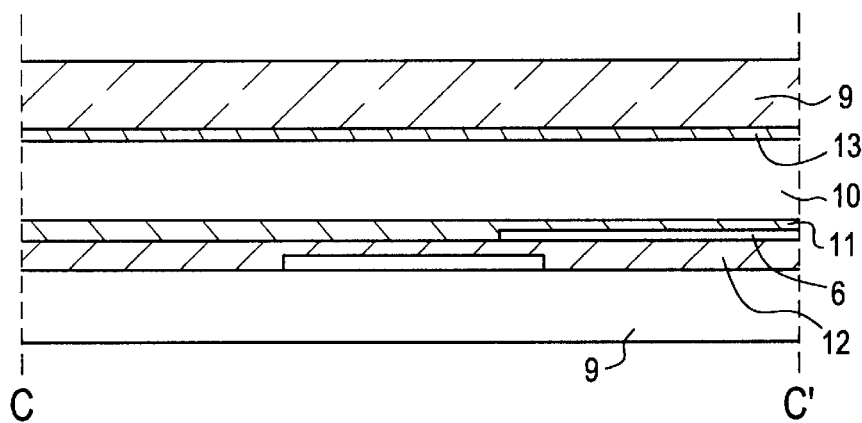
FIG. 5(c) is a section taken along the line C–C' of FIG. 4(c).
Figure 6A:
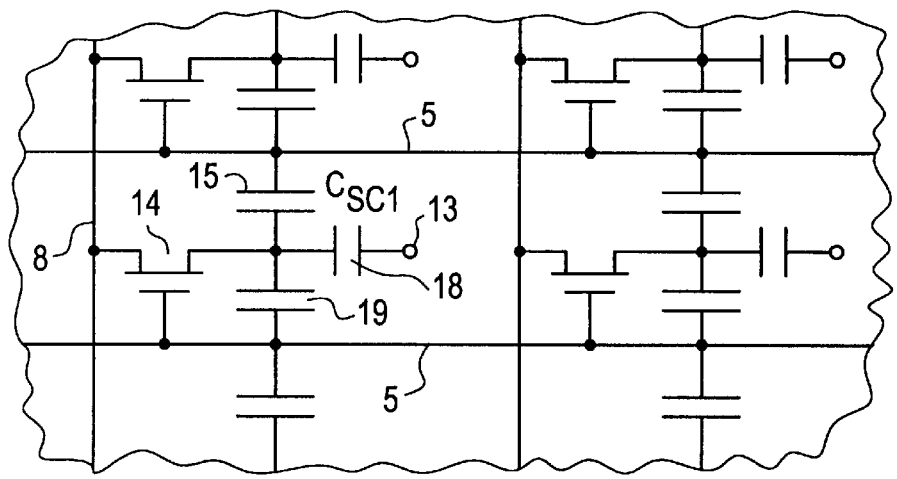
FIG. 6(a) is a circuit diagram of portion ① of FIG. 3.
Figure 6B:
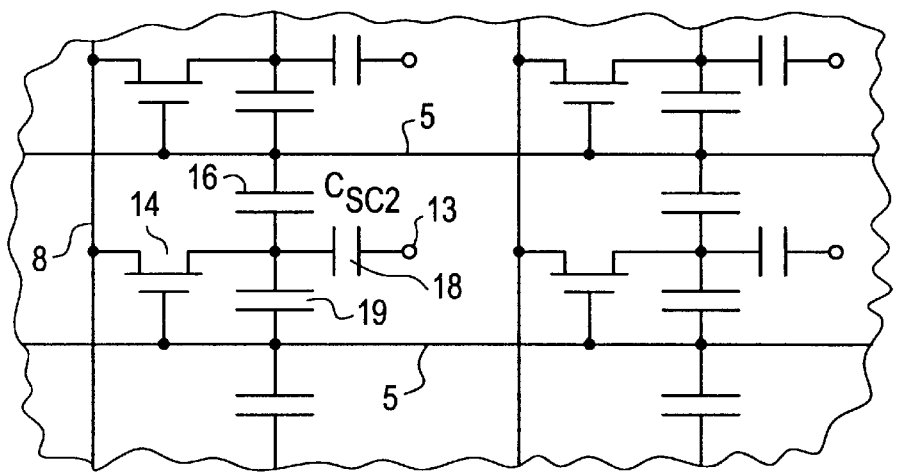
FIG. 6(b) is a circuit diagram of portion ② of FIG. 3.
Figure 6C:
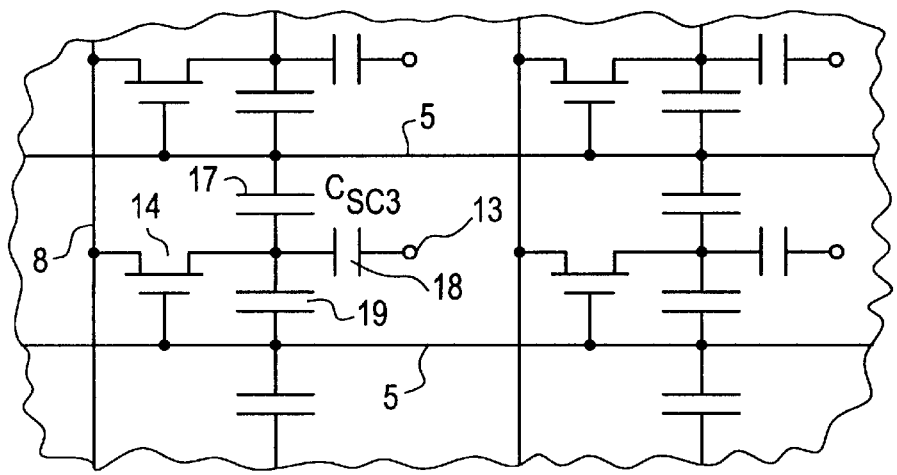
FIG. 6(c) is a circuit diagram of portion ③ of FIG. 3.

FIG. 3 is a plan showing a liquid crystal panel according to an embodiment of the present invention, FIG. 4 is an enlarged view of FIG. 3, FIG. 4(a) an enlarged view of left side center portion ① of a single mask exposure area shown in FIG. 3, FIG. 4(b) an enlarged view of central portion ② of the single mask exposure area shown in FIG. 3, FIG. 4(c) an enlarged view of right side center portion ③ of the single mask exposure area shown in FIG. 3, FIG. 5(a) a section taken along the line A–A' of FIG. 4(a), FIG. 5(b) a section taken along the line B–B' of FIG. 4(b), FIG. 5(c) a section taken along the line C–C' of FIG. 4(c), FIG. 6(a) a circuit diagram of potion ① of FIG. 3, FIG. 6(b) a circuit diagram of potion ② of FIG. 3, and FIG. 6(c) a circuit diagram of potion ③ of FIG. 3.

On a liquid crystal panel 1 shown in FIG. 3, display area 3 comprising 6 sections, in two rows and three columns, is formed by exposing the area to the light 6 times by the use of a single mask. A gate signal input part 2 is formed on one of the perpendicularly intersecting sides of the area 3, while a signal input part 2a is formed on the other side thereof. A hatched section represents an area 4 exposed by means of a single mask.

Further, in FIGS. 4(a)–(c) and 5(a)–(c), gate signal line 5 of required pattern is formed on glass substrate 9 to a size of one exposure area using the single mask, and after covering a portion of gate signal line 5 with a gate oxide film not shown, a source drain made of amorphous silicon or the like is formed to prepare a thin film transistor (TFT) 14.

Then drain signal line 8 is connected to the drain of TFT 14, interlayer insulation film 12 is layered so as to cover these items, pixel electrode 6 is formed on the film 12, and then pixel electrode 6 is connected to the source of TFT 14.

Pixel electrode 6 is superposed partially on gate signal line 5 connected to TFT14 and pixel electrode 6 through interlayer insulation film 12, and pixel electrode 6 and interlayer insulation film 12 are covered with protection film 12.

Further on a glass substrate 9 which is disposed in opposition to the glass substrate 9 prepared as described above, an opposite electrode 13 is formed, and liquid crystal 10 is filled into a space between the electrode 13 and the protection film 11.

As illustrated in FIGS. 4(a)–(c) and 5(a)–(c), at the formed left portion ① of exposure area 4 shown in FIG. 3 formed through the single mask exposure, the left portion ① being disposed on the side of gate signal input part 2, as shown in FIG. 6(a), storage capacity 15 is parasitically generated between the source of TFT 14 and gate signal line 5, gate source capacity 19 is parasitically generated between the gate and the source of TFT 14, and liquid crystal capacity ($C_{LC}$) is parasitically generated between the opposite electrode 13 and the source of TFT 14.

And storage capacity 16 and storage capacity 17 are parasitically generated at the central portion ② and right end portion ③, respectively, as shown in FIGS. 6(b), 6(c).

In the method for manufacturing thin film transistor array substrate of the present invention, as shown in FIGS. 4(a)–(c) and FIGS. 5(a)–(c), pixel electrode 6 and gate signal line 5 or pixel electrode 6 and an electrode, which is formed so to have an independent electric potential, are arranged so as to overlap each other through interlayer insulation film 12 to form an overlap portion 7 so that an auxiliary capacity formed in the overlap portion 7 can be varied in the single mask exposure area 4 in such a manner that the auxiliary capacity decreases stepwise as the distance from the gate signal input part 2 increases.

Here, in FIG. 3 to FIG. 6, with reference to the single mask exposure area 4, storage capacity 15 at the left side portion ① on the side of gate signal input part 2 is denoted by $C_{SC1}$, storage capacity 16 at the central portion ② by $C_{SC2}$, storage capacity 17 at the right side portion ③ by $C_{SC3}$. In order to compensate the feedthrough voltage in the single mask exposure area by varying the aforementined storage capacities continuously so that the storage capacities become $C_{SC1} > C_{SC2} > C_{SC3}$, the relation between $C_{SC1}$ and $C_{SC3}$ must satisfy the following equation (4).

$$C_{GS}/(C_{LC}+C_{SC1}+C_{GS}) \cdot \Delta V_G = (C_{GS} \cdot \Delta_G - \int I_{DS}dt)/(C_{LC}+C_{SC3}+C_{GS}) \quad (4)$$

Figure 7A:
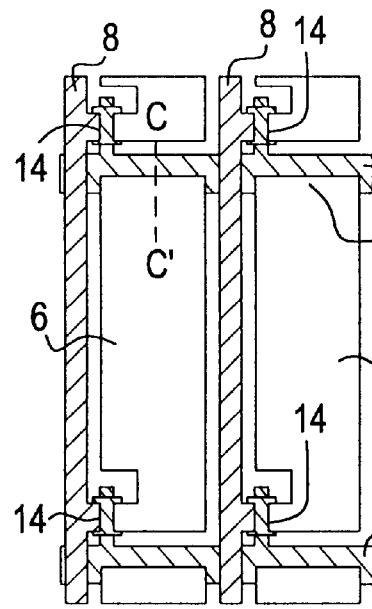
FIGS. 7(a) and (b) are an enlarged view obtained by expanding the connecting portion of exposure areas of FIG. 3.
Figure 7B:
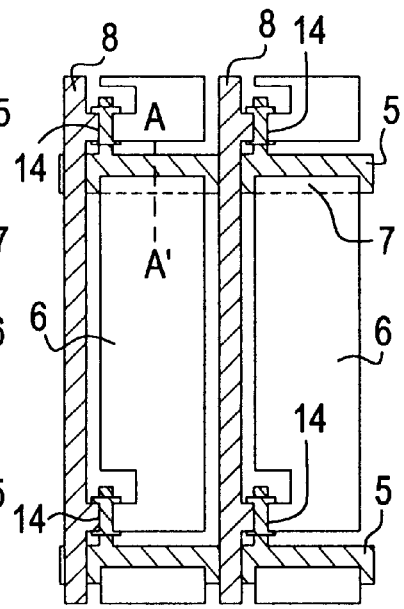

Next, an exposure process is applied onto the joint portions of the single mask exposure area 4 in FIG. 3 so that as shown in FIGS. 7(a), (b), right side portion ③ (or ⑤) and a left side portion ④ (or ⑥) are formed adjacent to each other.

Figure 8:
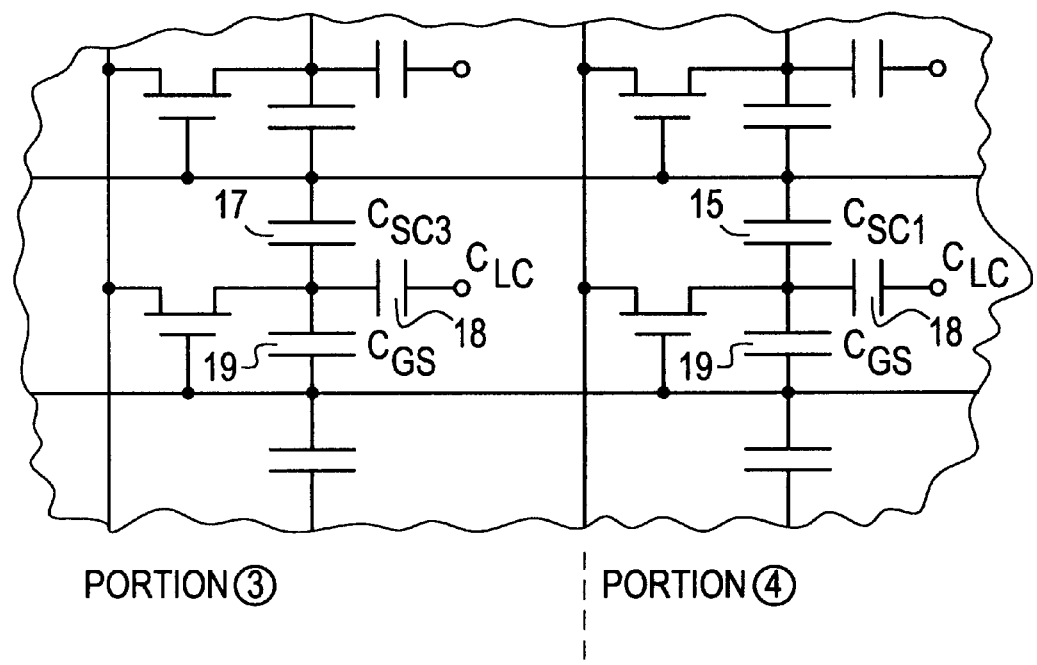
FIG. 8 is an equivalent circuit diagram of the connecting portion of exposure areas of FIG. 3.
Figure 9:
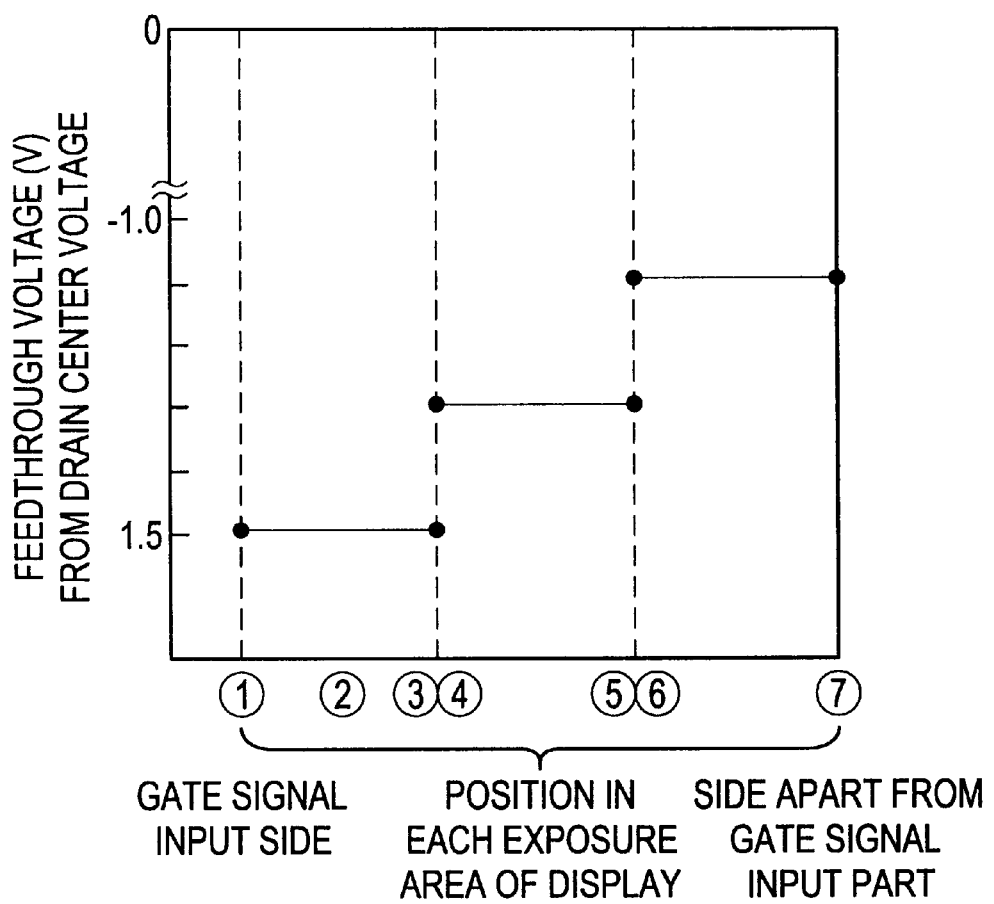
FIG. 9 is a view showing measurements of feedthrough voltages of portions ①–⑦ of FIG. 3.

An equivalent circuit of elements shown in FIGS. 7(a),(b) is given in FIG. 8. FIG. 8 illustrates joint portions ③ and ④ of FIGS. 7(a), (b) as an example. When exposure process is applied to joint portions ③, ④ and joint portions ⑤, ⑥ under the same exposure condition, the feedthrough voltage in each exposure area 4 from FIG. 3 ① to ⑦ varies stepwise, as shown in FIG. 9, in the single mask exposure area 4.

For calculating feedthrough voltages $V_{FD3}$, $V_{FD4}$ of exposure area joint portions ③, ④, following equations (5) and (6) are used.

$$V_{FD3}=(C_{GS} \cdot \Delta V_G + \int I_{DS}dt)/(C_{LC}+C_{SC3}+C_{GS1}) \quad (5)$$

$$V_{FD4}=(C_{GS} \cdot \Delta V_G + \int I_{DS}dt)/(C_{LC}+C_{SC1}+C_{GS1}) \quad (6)$$

For uniformalizing the feedthrough voltage in the display screen, it is necessary to make feedthrough voltage $V_{FD3}$ of the right side of exposure area 4 formed in row 1 column 1 by means of single mask and feedthrough voltage $V_{FD4}$ of the left side of exposure area 4 formed in by row 1 column 2 by means of single mask coincide with each other. However, liquid crystal capacity $C_{LC}$, and storage capacity $C_{SC1}$, $C_{SC2}$ are made constant.

In the method for manufacturing thin film transistor array substrate according to the present invention, exposure section 4 formed from array pattern is defined in the thin film transistor array substrate by a single mask stepping exposure, wherein a display 3 has thin film transistor 14 and pixel electrode 6 at a cross point of gate signal line 7 and drain signal line 8, and in the process for forming thin film transistor 14 within exposure section 4, an offset is made in such directions that an alignment offset increases every time an exposure is made so that, at the time of pattern exposure of drain electrode 22 of thin film transistor 14, overlapping area formed by the pattern of gate electrode 21 and that of source electrode 23 becomes larger as the distance from the gate signal input part 2 increases to increase parasitic capacity $C_{GS}$ between gate electrode 21 and source electrode 23.

Figure 10:
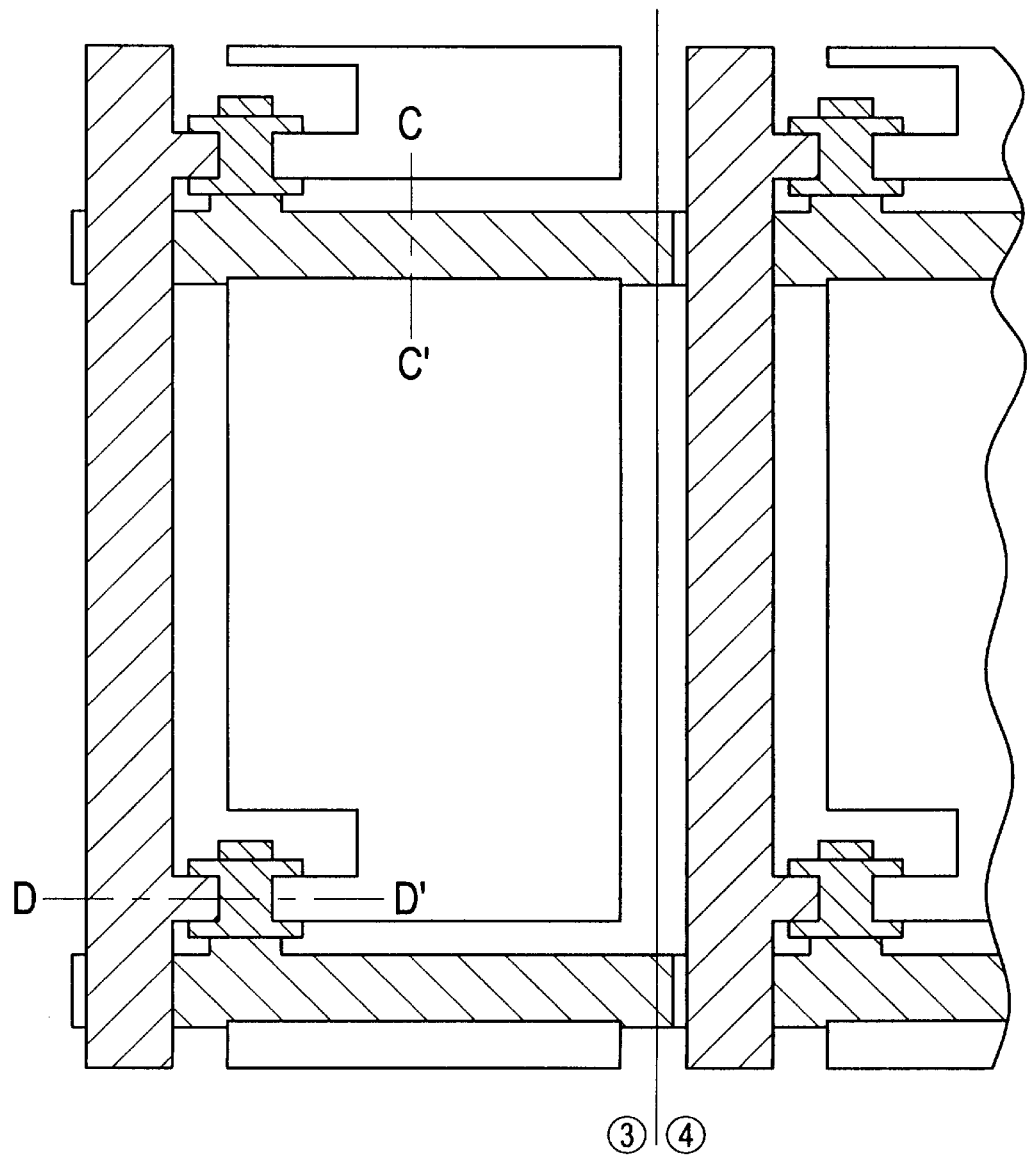
FIG. 10 is an enlarged view obtained by expanding the thin film transistors on exposure area connecting portions ③, ④ of FIG. 3.

An embodiment of the method for manufacturing thin film transistor array substrate according to the present invention will be described below with reference to FIGS. 10 and 11. FIG. 10 is a plan showing thin film transistor 14 in the thin film transistor array substrate according to the present invention, FIG. 11 is a section taken along the line D–D' of FIG. 10.

Figure 11:
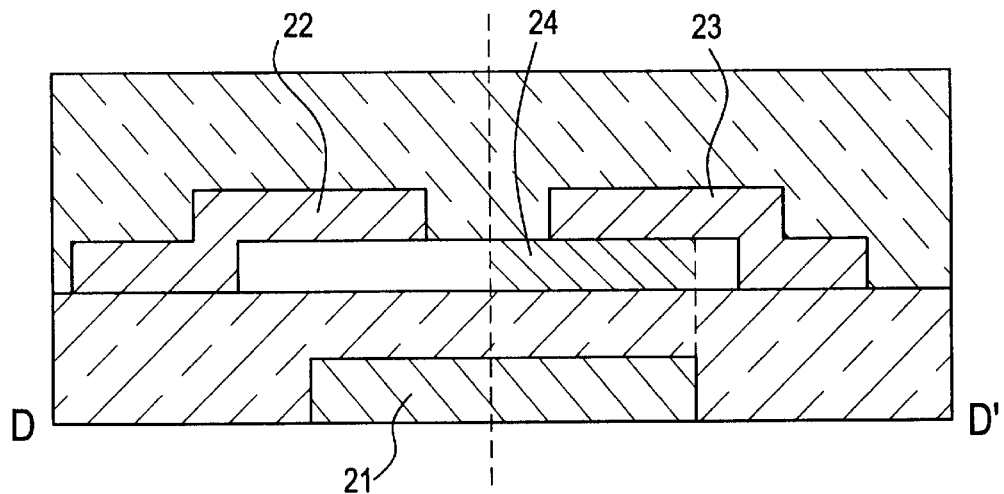
FIG. 11 is a section obtained by cutting the thin film transistors on exposure area connecting portion ③ of FIG. 3.

As shown in FIG. 11, the parasitic capacity between gate electrode 21 and source electrode 23 of the thin film transistor (TFT) is proportional to the area of interlayer insulation film 24 such as amorphous silicon which is disposed above gate electrode 21 extending from the center between drain electrode 22 and source electrode 23 of TFT channel portion toward the source electrode 23.

Figure 12:
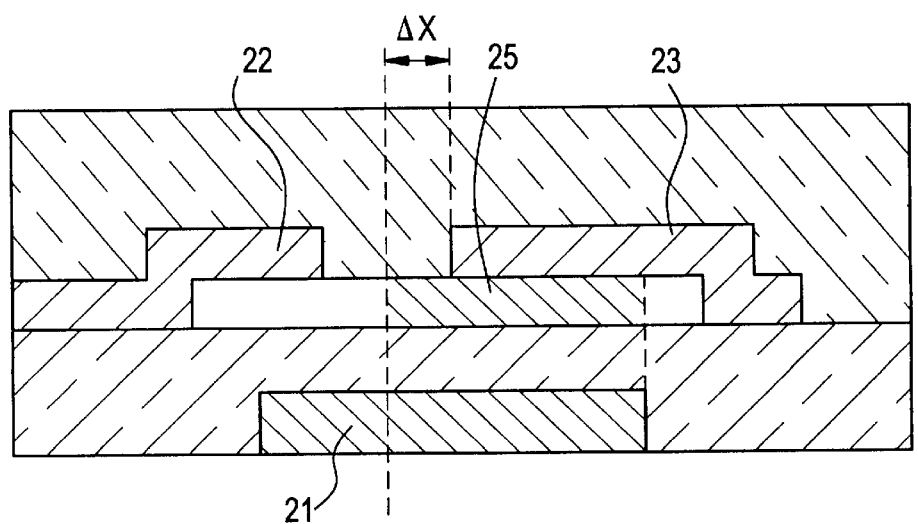
FIG. 12 is a section obtained by cutting the thin film transistors on exposure area connecting portion ④ of FIG. 3.

Here, as shown in FIG. 12, a pattern is formed by making an offset of $\Delta x$ in a direction of minus X from such state as shown in FIG. 11 so that overlap 24a between gate electrode 21 and source electrode 23 can be increased at the time of exposure of drain electrode 22 and source electrode 23, whereby the storage capacity between gate electrode 21 and source electrode 23 of TFT 14 is increased from $C_{GS1}$ to $C_{GS2}$.

Figure 13:
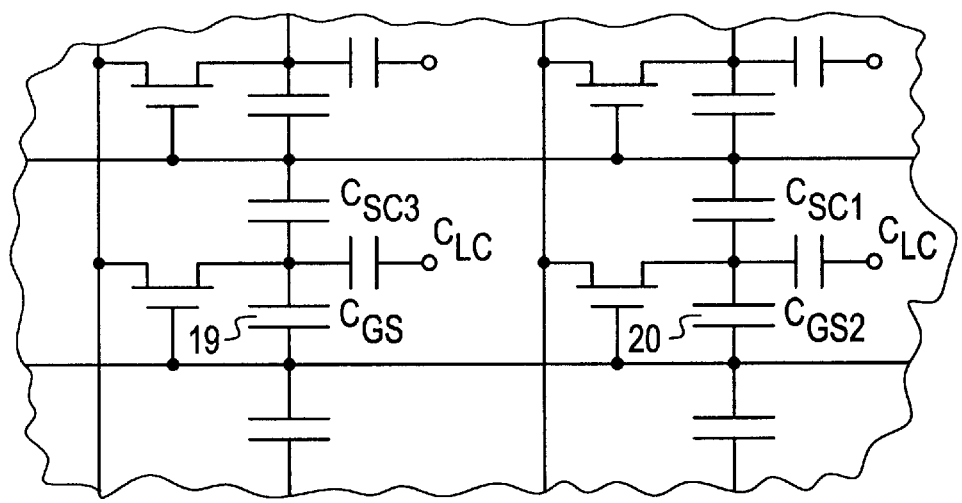
FIG. 13 is an equivalent circuit diagram of portions ③, ④ shown in FIG. 3, when the exposure system according to the present invention is applied.

An equivalent circuit corresponding to the state shown in FIG. 12 is shown in FIG. 13. In this case, feedthrough voltage $V_{FD4}$ of portion ④ shown in FIG. 3 is expressed by equation (7).

$$V_{FD4}=(C_{GS2} \cdot \Delta V_G + \int I_{DS}dt)/(C_{LC}+C_{SC1}+C_{GS2}) \quad (7)$$

Equation (7) differs from equation (6) only in that $C_{GS1}$ in equation (6) is changed to $C_{GS2}$ in equation (7).

In this mananer, by varying storage capacity $C_{GS}$ between gate electrode 21 and source electrode 23 of TFT 14, feedthrough voltage $V_{FD3}$ of portion ③ and feedthrough voltage $V_{FD4}$ of portion ④ shown in FIG. 3 become equal to each other so that an equation (8) is established.

$$(C_{GS} \cdot \Delta V_G - \int I_{DS}dt)/(C_{LC}+C_{SC3}+C_{GS1})=(C_{GS2} \cdot \Delta V_G - \int I_{DS}dt)/(C_{LC}+C_{SC1}+C_{GS2}) \quad (8)$$

Where, since values of electric current $\int I_{DS}dt$ which flows from a source electrode to a drain electrode due to the by the rounding of gate pulses generated by the gate wiring resistance are estimated to the equal with reference to portion ③ and portion ④ shown in FIG. 3, equation (8) can be approximated to equation (9).

$$(C_{GS} \cdot \Delta V_G)/(C_{LC}+C_{SC3}+C_{GS1}) = (C_{GS2} \cdot \Delta V_G)/(C_{LC}+C_{SC1}+C_{GS2}) \quad (9)$$

If $\Delta V$ is omitted, $$C_{GS}/(C_{LC}+C_{SC3}+C_{GS}) = C_{GS2}/(C_{LC}+C_{SC1}+C_{GS2})$$

consequently, $C_{GS2}$ is expressed by equation (10) as follows.

$$C_{GS2} = (C_{GS} \cdot (C_{LC}+C_{SC1}))/(C_{LC}+C_{SC3}) \quad (10)$$

By adjusting $C_{GS2}$ so as to satisfy equation (10), the feedthrough voltages of portions ③ and ④ in FIG. 3 can be made identical even if the single exposure mask is used.

Figure 14:
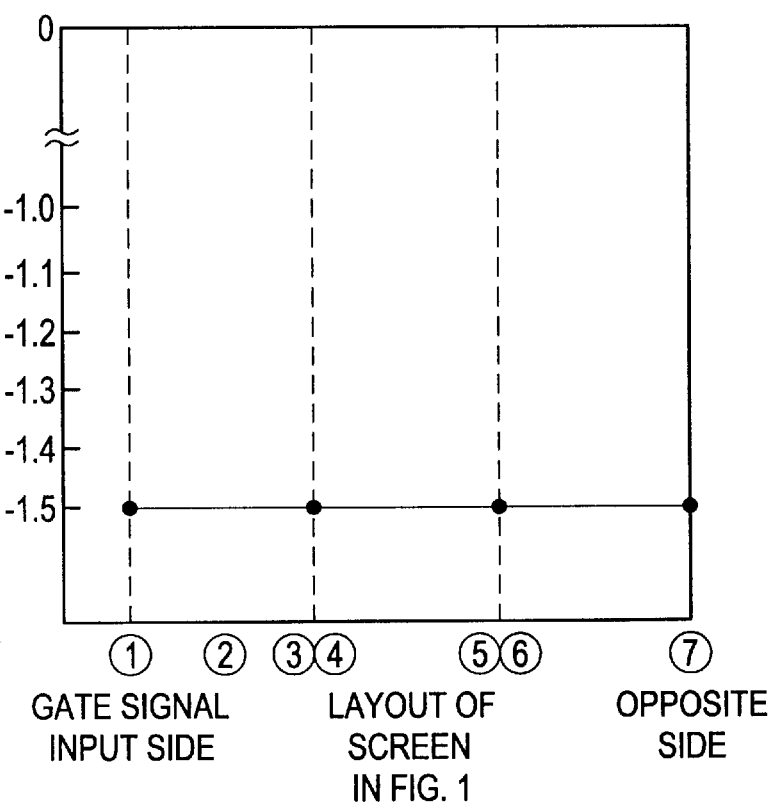
FIG. 14 is a view showing measurements of feedthrough voltages of portions ①–⑦ shown in FIG. 3, when the exposure system according to the present invention is applied.

Although the above descriptions are made with reference to lateral joint portions ③ and ④ of single mask exposure area 4 in FIG. 3, by processing portions ⑤ and, ⑥ in the same manner, a liquid crystal display panel in which feedthrough voltages are uniformalized, as shown in FIG. 14, in the portions in the display ranging from portion ① to portion ⑦ of FIG. 3 can be obtained.

Further, the manufacturing method of the present invention can be applied even if wiring constituting the storage capacity is either gate wiring or auxiliary capacity wiring, and moreover the method can be realized even if the forming direction of transistors is vertical or horizontal.

As described above, according to the present invention, in the exposure area formed by using a single mask, a mask, in which the feedthrough voltage of the right side and the left side of the exposure area is compensated by mean of the storage capacity is, used, and an offset is made every time exposure pattern is formed so that parasitic capacity $C_{GS}$ of the thin film transistor is increased, whereby even if multiple stepping exposure is applied using a single exposure mask, the thin film transistor array substrate which is excellent in characteristics and reliability can be obtained, while the differences in feedthrough voltage is very small between the right and left side of the thin film transistor array substrate.

It is to be understood that variations and modifications of the embodiment disclosed herein will be evident to those skilled in the art. It is intended that all such modifications and variations be included within the scope of the appended claims.

What is claimed:

1. A method for manufacturing a thin film transistor array substrate by forming on the thin film transistor array substrate a display formed from array patterns by stepping exposure by the use of a single mask, said method comprising the steps of:

providing a thin film transistor and pixel electrode at the intersection of a gate signal wire and a drain signal wire; and forming the thin film transistor within an exposure area through a single mask, wherein when the pattern of a drain electrode of the thin film transistor is exposed, an offset is made in such a direction as to increase alignment offset every time exposure is made so that the magnitude of overlap between the pattern of a gate electrode and the pattern of a source electrode increases the farther the overlap is from the input part of the gate signal wire to increase the parasitic capacity between the gate electrode and the source electrode.

2. The method according to claim 1, wherein the value of auxiliary capacity produced in an overlapping portion formed by overlapping said pixel electrode and gate signal wire, or said pixel electrode and an electrode formed so as to have electric potential independent of the pixel electrode and interposing an interlayer insulation layer therebetween is varied in the single mask exposure area so that the value is made smaller the farther the overlapping portion is from the gate signal input part.

* * * * *